United States Patent
Simkins

(10) Patent No.: US 7,797,610 B1
(45) Date of Patent: Sep. 14, 2010

(54) METHOD AND APPARATUS FOR VIRTUAL QUAD-PORT RANDOM ACCESS MEMORY

(75) Inventor: James M. Simkins, Park City, UT (US)

(73) Assignee: Xilinx, Inc., San Jose, CA (US)

( * ) Notice: Subject to any disclaimer, the term of this patent is extended or adjusted under 35 U.S.C. 154(b) by 695 days.

(21) Appl. No.: 11/184,310

(22) Filed: Jul. 19, 2005

(51) Int. Cl.
G11C 29/00 (2006.01)
(52) U.S. Cl. .................................. 714/763
(58) Field of Classification Search .............. 714/763
See application file for complete search history.

(56) References Cited

U.S. PATENT DOCUMENTS

| | | | | |
|---|---|---|---|---|
| 4,893,279 | A * | 1/1990 | Rahman et al. | 365/230.03 |
| 5,115,393 | A * | 5/1992 | Kashiyama et al. | 711/169 |
| 5,155,843 | A * | 10/1992 | Stamm et al. | 714/5 |
| 5,588,112 | A * | 12/1996 | Dearth et al. | 714/9 |
| 5,594,365 | A * | 1/1997 | Agrawal et al. | 326/40 |
| 6,093,213 | A * | 7/2000 | Favor et al. | 703/27 |
| 6,101,614 | A * | 8/2000 | Gonzales et al. | 714/6 |
| 6,792,567 | B2 * | 9/2004 | Laurent | 714/763 |
| 6,977,655 | B2 * | 12/2005 | Ryan | 345/533 |
| 7,007,099 | B1 * | 2/2006 | Donati et al. | 709/237 |
| 2002/0031166 | A1 * | 3/2002 | Subramanian et al. | 375/130 |
| 2003/0056061 | A1 * | 3/2003 | Sherman | 711/131 |
| 2004/0162933 | A1 * | 8/2004 | Adiletta et al. | 711/104 |
| 2005/0081125 | A1 * | 4/2005 | Cochran et al. | 714/56 |

OTHER PUBLICATIONS

Gernot Hueber et al.; "Parallelization Technique for a Interface Board for DVB-S/IP Compliant Data Transfer"; International Conference and Workshop: Telecommunications and Mobile Computing, tcmc2001; Graz University of Technology; Oct. 15-16, 2001; pp. 1-3.
Nick Sawyer et al.; "Quad-Port Memories in Virtex Devices"; XAPP228, (v1.0), Sep. 24, 2002; available from Xilinx, Inc., 2100 Logic Drive, San Jose, California 95124; pp. 1-5.

* cited by examiner

*Primary Examiner*—Scott T Baderman
*Assistant Examiner*—Enam Ahmed
(74) *Attorney, Agent, or Firm*—LeRoy D. Maunu; Lois D. Cartier

(57) ABSTRACT

Embedded logic circuits in combination with a configurable logic resources on a common integrated circuit facilitates over-clocked operation of embedded, dual-port memory blocks. The implementation yields fully independent and simultaneous read/write access to the dual-port memory blocks from the configurable logic on each clock cycle of the configurable logic. Error detection/correction and data scrubbing is also facilitated by the embedded logic circuits, such that error detection/correction is completely transparent to the configurable logic, while data scrubbing is performed with minimal degradation to the memory access bandwidth of the configurable logic.

11 Claims, 6 Drawing Sheets

METHOD AND APPARATUS FOR VIRTUAL QUAD-PORT RANDOM ACCESS MEMORY

FIELD OF THE INVENTION

The present invention generally relates to integrated circuits (ICs), and more particularly to ICs having improved memory access bandwidth to existing memory blocks.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these PLDs, the functionality of the device is determined by the data bits used to configure the reconfigurable resources of the device. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

In many communication applications, for example, PLD based systems are used to balance the efficiency of Application Specific Integrated Circuits (ASICs) with the flexibility of software. In such systems, the PLD off-loads the Central Processing Unit (CPU) for specific algorithms that are not efficiently handled within the CPU. While the PLD affords the user with great flexibility of design, it may also hinder the user due to the lack of performance that may be achieved within the configurable portions of the PLD.

In particular, the configurable portion of the PLD, i.e., the "fabric" or "reconfigurable resources", affords a frequency of operation that is generally lower than a frequency of operation that may be obtainable within an embedded logic circuit. Further, functions associated with the embedded logic circuit may tend to off-load some of the configuration and management overhead that is often associated with functions allocated to the fabric. Still further, a large portion of the fabric may be left unused in many user applications, therefore, implementing embedded logic circuits makes efficient use of semiconductor die area that otherwise is wasted.

SUMMARY

To overcome limitations in the prior art, and to overcome other limitations that will become apparent upon reading and understanding the present specification, the present invention discloses an apparatus and method for allocating an embedded logic circuit within the BRAM of a PLD to provide virtual quad-port functionality. The embedded logic circuit further provides input registering capability along with a transparent Error Correction Code (ECC) and associated scrubbing function.

In accordance with one embodiment of the invention, an integrated circuit (IC) comprises a plurality of configurable logic resources that are coupled to a plurality of configurable interconnect resources. The FPGA further comprises an embedded logic circuit that implements a non-configurable function and is coupled to the configurable logic resources and is adapted to exchange internal data with the configurable logic resources. The hardwired logic circuit includes an input register bank that is coupled to latch a plurality of signals received from the configurable logic resources at a first clock rate and a random access memory (RAM) bank that is coupled to receive a write address and a read address from the input register bank and is adapted to provide write and read access to storage locations within the RAM bank at a second clock rate that is faster than the first clock rate.

In accordance with another embodiment of the invention, an embedded logic circuit exists within a programmable logic device (PLD). The embedded logic circuit comprises a first multiplexer that is coupled to receive user data and scrubbing data and is adapted to provide the user data in response to a first level of a control signal and is adapted to provide the scrubbing data in response to a second level of the control signal. The embedded logic circuit further comprises a random access memory (RAM) block that is coupled to the first multiplexer and is adapted to retrieve stored user data from a first address. The RAM block includes an error correction coding (ECC) block that is adapted to detect errors in the retrieved user data and is adapted to generate the first level of the control signal in response to an absence of detected errors and is adapted to generate the second level of the control signal and the scrubbing data in response to a presence of detected errors. The RAM block is adapted to overwrite the retrieved user data at the first address with the scrubbing data in response to the second level of the control signal.

In accordance with another embodiment of the invention, a method of increasing memory access bandwidth comprises generating simultaneous read and write access requests at a first clock rate from within configurable logic resources, registering the read and write access requests from within an embedded logic circuit, and sequentially processing the read and write access requests from within the embedded logic circuit at a second clock rate that is faster than the first clock rate.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
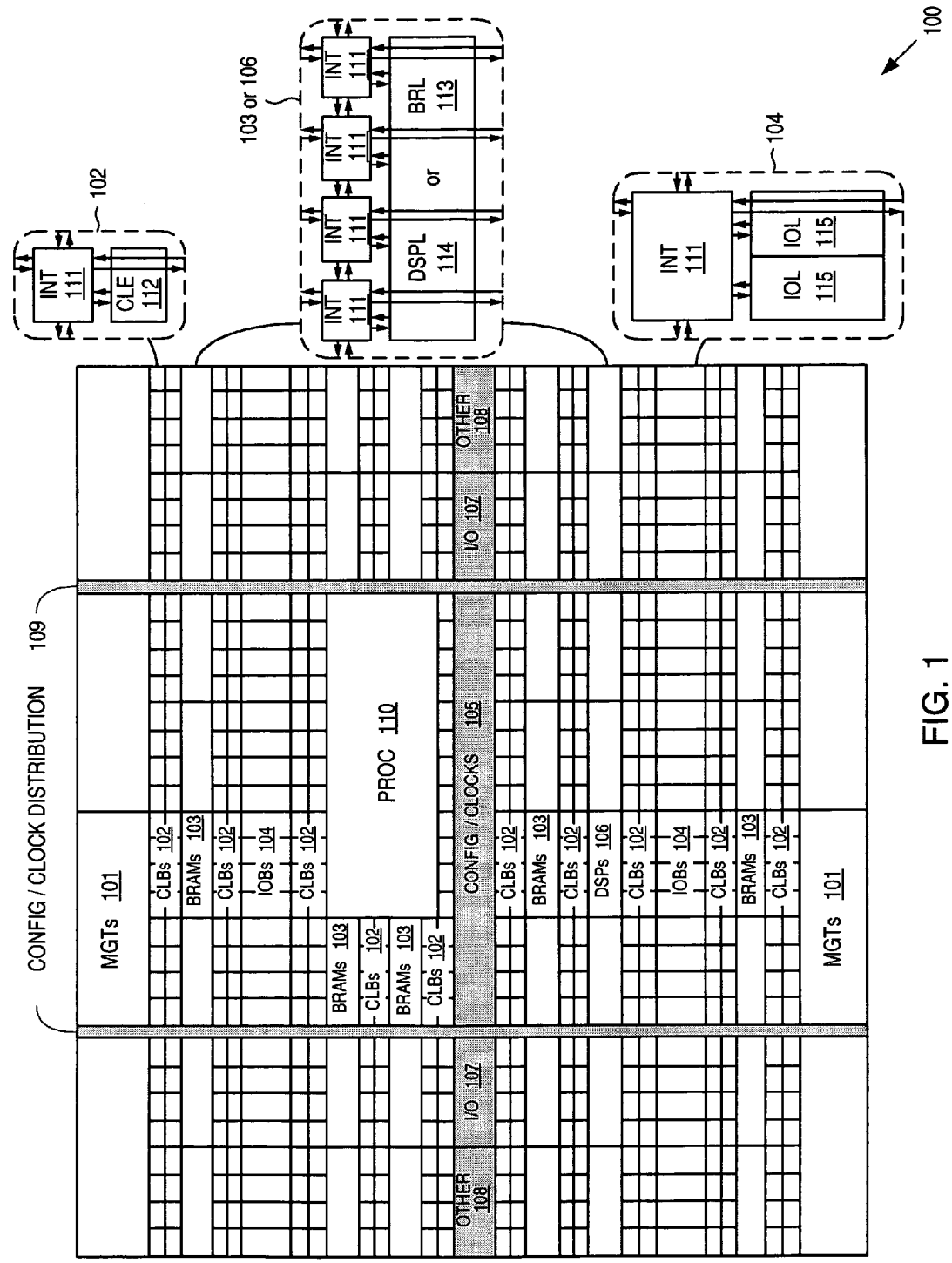
FIG. 1 illustrates an exemplary Field Programmable Gate Array (FPGA) architecture.

Generally, the present invention is applied to the field of integrated circuits (IC) of which PLDs are a subset. In particular, the present invention provides ICs that include an embedded logic circuit for increasing the memory access bandwidth to block memories that are provided within the ICs. While the conventional method of access to these block memories is performed in dual-port fashion, embodiments of the present invention contemplate providing quad-port access to at least some of those same dual-port block memories.

In particular, appropriate control and registering logic within the embedded logic circuit allows a significant increase in operational frequency. That is to say, that since the clocking and data transfer rates are significantly restricted within the PLD fabric, porting the appropriate control and registering logic to the faster embedded logic circuit allows for a significant increase in operational bandwidth.

Thus, embodiments of the present invention contemplate operating portions of the embedded logic circuit at clock frequencies that are, for example, double the clock frequencies operating within the PLD fabric. In such an instance, portions of the embedded logic circuit are "double pumped", which is to say that for every PLD fabric clock cycle, two clock cycles have occurred within the hardwired logic circuit. Higher embedded logic circuit clock frequencies, such as quadruple the clock frequencies that are operating within the PLD fabric, may also be utilized in accordance with an embodiment of the present invention for a "quadruple pumped" mode of operation within the embedded logic circuit.

In one embodiment of the present invention, the double pumped mode of operation allows a substantially increased memory I/O efficiency in relation to the PLD fabric, since read and write operations, as directed by the PLD fabric, may occur simultaneously with respect to the PLD fabric. Thus, while the BRAM core exhibits a dual-port configuration, a virtual quad-port operation is contemplated through operation of embodiments of the present invention.

As such, separate read and write data buses, separate read and write address buses, and associated control circuitry, is now made available to the PLD fabric by the embedded logic circuit. Thus, four user ports are provided to the PLD fabric which may be accessed by the PLD fabric for independent read and write operations. In addition, registering capability is provided within the embedded logic circuit, so that the address and data busses entering the embedded logic circuit are latched and the data busses exiting the embedded logic circuit are latched. As such, clock loading within the PLD fabric has no effect on clock operations within the embedded logic circuit.

In addition, ECC functionality is embedded within the BRAM, so that if errors are detected after a BRAM read operation, not only will the corrected data be provided to the PLD fabric in response to the read operation, but the erroneous data may also be overwritten, or scrubbed, using the corrected data during a subsequent write operation into the corrupted data location of the BRAM. Furthermore, since the scrubbing operation is being performed within the embedded logic circuit clock domain, e.g., at least twice as fast as the PLD fabric clock domain, the scrubbing operation is substantially transparent to the PLD fabric. Thus, through operation of the scrubbing function in accordance with an embodiment of the present invention, erroneous data may be automatically corrected. Whether or not the ECC and scrubbing functions are automatically performed, may be dynamically selected by the PLD fabric via an input control signal or may be statically selected by configuration memory cell control.

As noted above, advanced ICs, such as FPGAs, can include several different types of programmable logic blocks in the array. For example, FIG. 1 illustrates an IC that exemplifies FPGA architecture 100, including a large number of different programmable tiles such as Multi-Gigabit Transceivers (MGTs) 101, CLBs 102, BRAMs 103, IOBs 104, configuration and clocking logic CONFIG/CLOCKS 105, DSPs 106, specialized I/O 107, including configuration ports and clock ports, and other programmable logic 108, such as digital clock managers, analog-to-digital converters, system monitoring logic, and so forth.

In some FPGAs, each programmable tile includes programmable interconnect element INT 111 having standardized connections to and from a corresponding interconnect element in each adjacent tile. Therefore, the programmable interconnect elements taken together implement the programmable interconnect structure for the illustrated FPGA. INT 111 also includes the connections to and from the programmable logic element within the same tile, as shown by the examples of blocks 102 and 104.

For example, a CLB 102 may include a Configurable Logic Element CLE 112 that may be programmed or re-programmed (i.e., reconfigured) to implement user logic plus a single programmable interconnect element INT 111 (that also may be configured or reconfigured). A BRAM 103 can include a BRAM logic element (BRL 113) in addition to one or more programmable interconnect elements. In accordance with an embodiment of the present invention, however, an embedded logic circuit is incorporated within BRAM 103, in addition to the programmable interconnect elements, so that quad-port RAM and ECC functionality may be provided within an embedded logic circuit to enhance performance.

Typically, the number of interconnect elements included in a tile depends on the height of the tile (as measured from right to left of FIG. 1). In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 may include, for example, two instances of an input/output logic element IOL 115 in addition to one instance of the programmable interconnect element INT 111.

As will be clear to those of skill in the art, the actual I/O pads connected, for example, to the I/O logic element 115 are manufactured using metal layers above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 may span several columns of CLBs and BRAMs.

Note that FIG. 1 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 102, 103, and 104 are purely exemplary. For example, in an actual FPGA more than one adjacent column of CLBs is typically included wherever the CLBs appear, to facilitate the efficient implementation of user logic.

Figure 2:
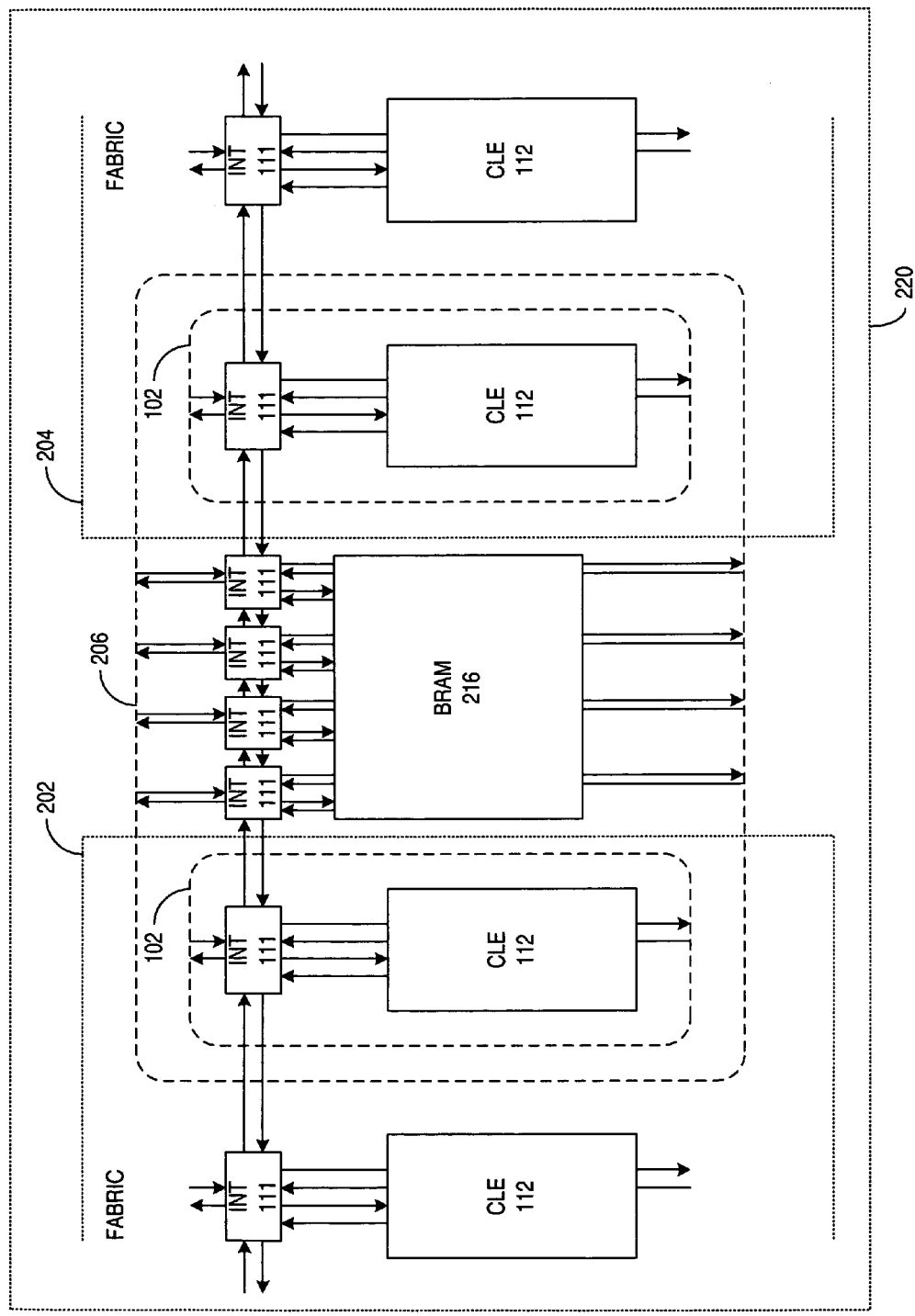
FIG. 2 illustrates an exemplary Field Programmable Gate Array (FPGA) application.

Turning to FIG. 2, an exemplary FPGA block diagram is illustrated in which a portion of FPGA 220 is used to implement a BRAM core 206 via configurable logic blocks (CLB) 102 and BRAM 216. BRAM 216 corresponds, for example, to BRAM 103 of FIG. 1 having interconnect tiles 111. BRAM 216 corresponds to a generic block of data storage, e.g., 18 Kbits of data storage that may be accessed via CLBs 102 to provide storage capability to FPGA fabric 202 and 204.

Any one of a number of memory block functions may be established via software configuration primitives. A software configuration primitive may be used to define BRAM core 206 attributes that are desired for a particular configuration. For example, software configuration primitives may be used to define the BRAM data content at initialization, the read/write data bus widths, and the write mode that is to be used, e.g., write first, or read first, by the BRAM primitive during operation.

In addition to the basic BRAM attributes listed above, other software configuration primitives may be used to extend the software configurable operation of BRAM core 216. For example, a large percentage of FPGA designs configure BRAM core 206 for use as a first-in, first-out (FIFO) buffer. The FIFO may be software configurable to support common, or independent, read and write clocks. Since BRAM 216 is a dual-port RAM having ports A and B, port A may be configured, for example, as the FIFO write port, while port B may be configured as the FIFO read port. Independent read and write port width selections may also be software configurable through appropriate combination of CLB resources.

While software configuration of BRAM core 206 may be highly desirable for many block memory applications, many other block memory applications exist that do not readily lend themselves to software configuration. For example, at higher clock rates, relative component placement within the BRAM core can become critical. In such instances, software configuration may not provide the user of FPGA 220 with enough flexibility to particularly define the placement of software configurable components to meet his or her needs. In other applications, the clock rates may simply exceed the physical capabilities of the FPGA fabric.

Figure 3:
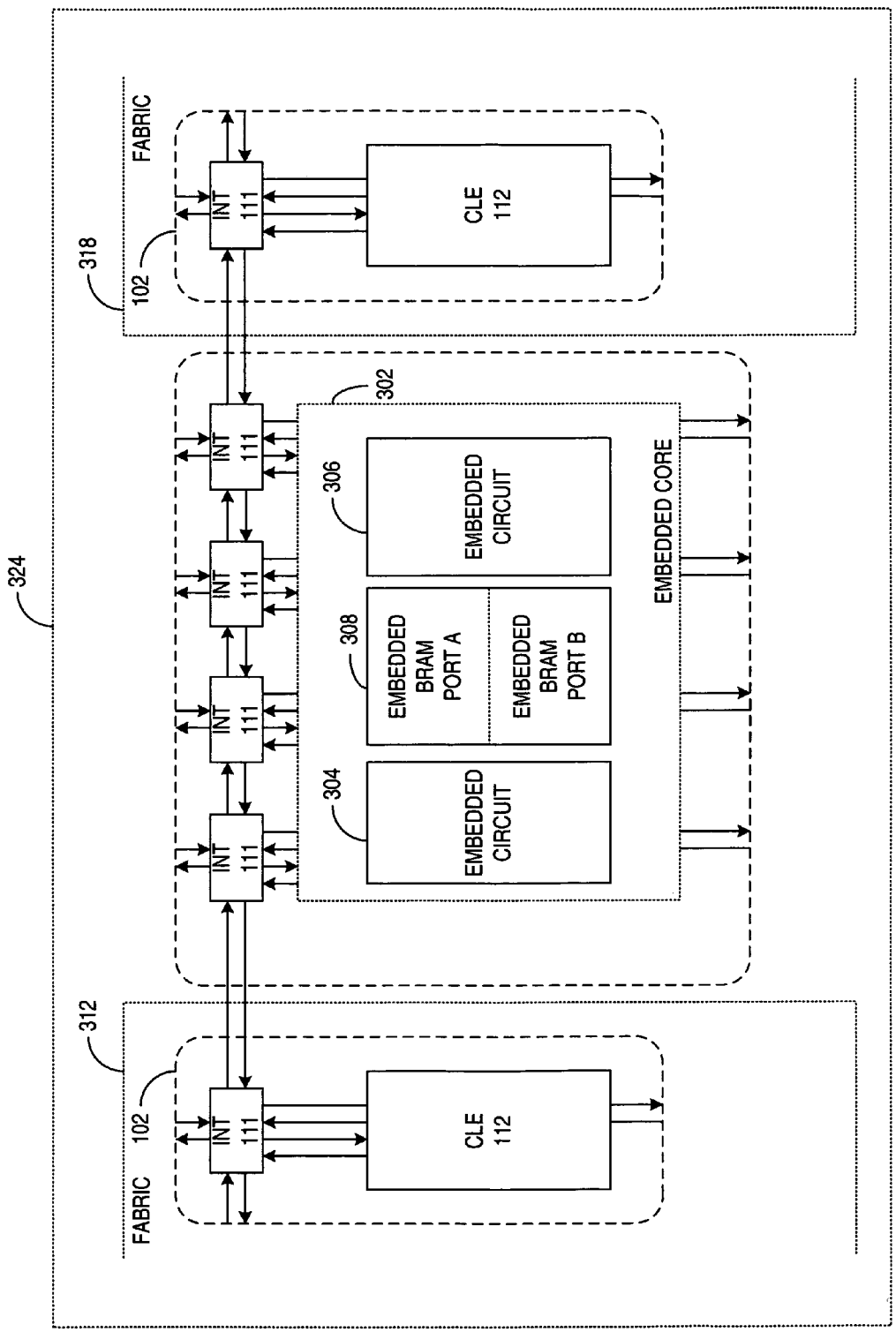
FIG. 3 illustrates an exemplary Field Programmable Gate Array (FPGA) application in accordance with the present invention.

In such applications, therefore, embedded logic or hardwired circuits are the preferred method for implementation, since component placement and speed of operation are more conducive to the user's particular needs. Such a block diagram is illustrated in FIG. 3, which is in accordance with an embodiment of the present invention. While CLBs 102 remain in FPGA fabric 312 and 318 of FPGA 324, embedded core 302 is external to the FPGA fabric and implemented to achieve the required performance. Embedded core 302 is coupled to programmable interconnect tiles 111 so that interconnectivity with FPGA fabric 312 and 318 via CLBs 102 may be established.

In particular, embedded logic circuits 304, 306 are placed in appropriate vicinity to embedded, dual-port BRAM 308 so that, for example, clock run lengths can be better controlled. Embedded core 302 also represents the custom placement of hardware and its associated control in such a way that may not be possible with a conventional hardware description language (HDL).

That is to say, for example, that the primitive libraries used by the FPGA software configuration tool may not have the appropriate definitions of hardware that the user of FPGA 324 wishes to use. Either the HDL libraries that could be used to define BRAM core 206 do not contain the hardware of interest, or the HDL libraries that could be used to define BRAM core 206 have inadequate definitions for the hardware components that they do contain.

In such situations, it is desirable to implement the particular BRAM application within an embedded logic circuit, such as embedded core 302, while at the same time, providing FPGA fabric access to embedded core 302 via INTs 111. Thus, while FPGA fabric 312 and 318 of FPGA 324 may be reconfigured as needed for the particular user application of interest, embedded core 302 has only limited reconfigurability (see FIG. 4).

It should be noted that dual-port BRAM 308 is differentiated from BRAM core 206 of FIG. 2, due to the fact that dual-port BRAM 308 is dedicated hardwired logic and cannot be configured (or reconfigured). Conversely, BRAM core 206 may undergo many configuration changes simply by downloading a stream of configuration data into the relevant configuration memory cells. Examples of BRAM core 206 may be found in the Virtex 2 or Virtex 4 FPGA from Xilinx, Inc. of San Jose, Calif.

In one embodiment in accordance with an embodiment of the present invention, embedded core 302 provides a double pumped mode of operation, whereby access to dual-port RAM 308 is controlled by a clock signal that is running at twice the speed of the clock running in FPGA fabric 312 and 318. Such a configuration allows a substantially increased memory access bandwidth in relation to FPGA fabric 312 and 318, since read and write operations, as directed by the FPGA fabric, may occur simultaneously. Thus, while embedded core 302 incorporates dual-port RAM 308, a virtual quad-port operation is contemplated through operation of an embodiment of the present invention, since each port, port A and port B, of dual-port BRAM 308 is double pumped with respect to FPGA fabric 312 and 318.

In addition, ECC functionality is embedded within BRAM 308 in accordance with another embodiment of the present invention, so that if errors are detected after a read operation, not only will the corrected data be provided in response to the read operation, but the erroneous data may also be overwritten, or scrubbed, using the corrected data during a subsequent write operation into the corrupted BRAM.

Furthermore, since the scrubbing operation is being performed within the embedded logic clock domain, the scrubbing operation is substantially transparent to FPGA fabric 312 and 318. Thus, through operation of the scrubbing function in accordance with an embodiment of the present invention, erroneous data may be automatically corrected and flushed to prevent error accumulation.

Figure 4:
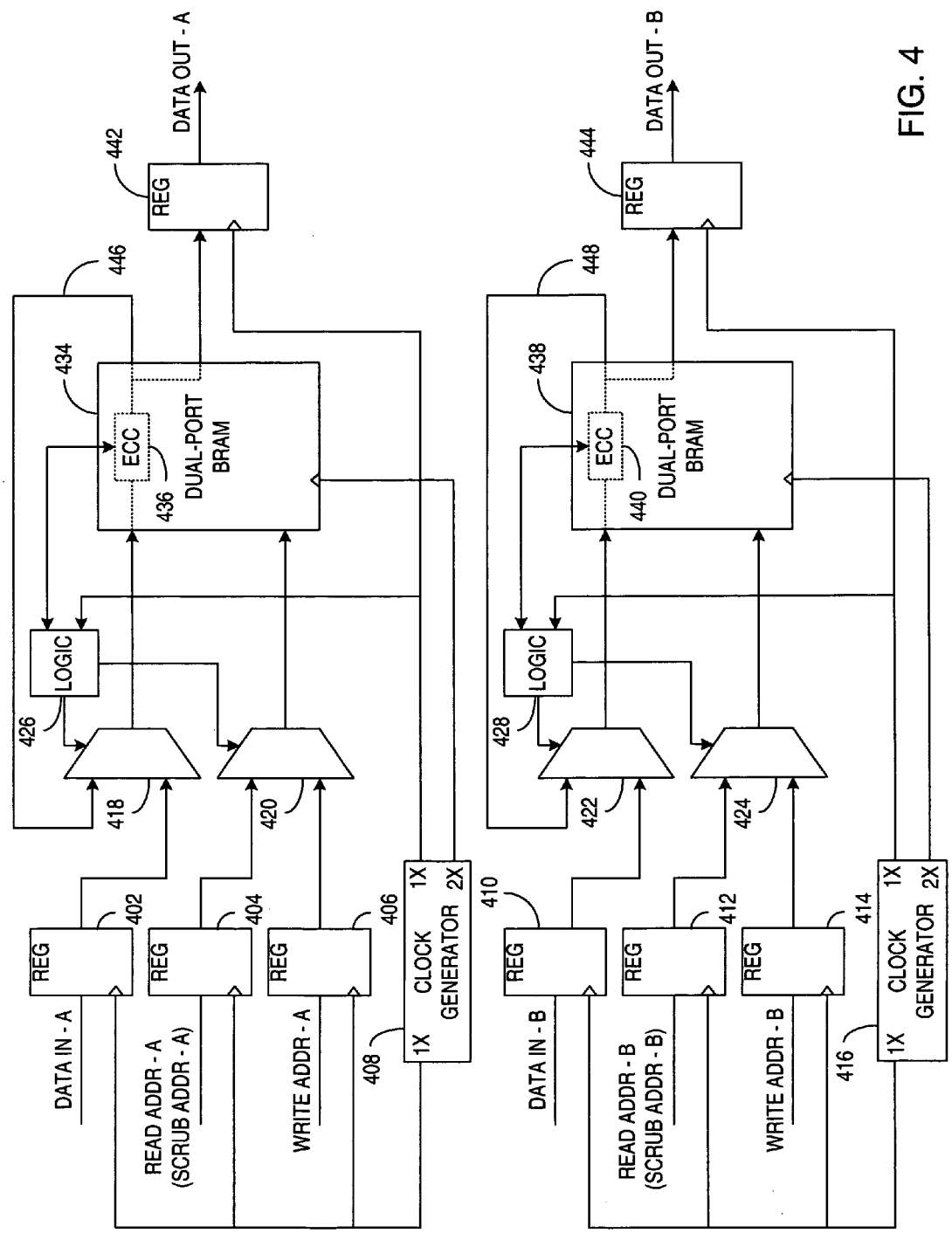
FIG. 4 illustrates an exemplary embedded logic circuit block diagram in accordance with the present invention.

Turning to FIG. 4, a detailed block diagram of embedded core 302 is exemplified, in which embedded core 302 operates as a virtual quad-port RAM through appropriate design and permanent placement of embedded logic circuits 304 and 306. In particular, registers 402-406 provide address and data latching capability for port A access from the FPGA fabric, registers 410-414 provide address and data latching capability for port B access from the FPGA fabric, and data registers 442-444 provide output data latching capability for both ports A and B, respectively, to the FPGA fabric.

Both inputs of multiplexers 420 and 424 are coupled to each of the respective port address registers, 404-406 and 412-414, while second inputs of multiplexers 418 and 422 are coupled to the outputs of ECC blocks 436 and 440, which are imbedded within dual-port BRAMs 434 and 438, respectively. Data access requests from ports A and B are clocked through registers 402-406 and 410-414 and multiplexers 418-424 at the 1× clock rate of clock generators 408 and 416, while BRAM access is conducted at the 2× clock rate of clock generators 408 and 416, while BRAM access is conducted at the 2× clock rate of clock generators 408 and 416.

Optional embedded ECC blocks 436 and 440 may be used to minimize undesired consequences of data corruption. Simply stated, data corruption exists when data written to specific data storage locations within BRAMs 434 and 438 does not match the data that is subsequently retrieved from those same data storage locations. ECCs may, therefore, be generated by ECC blocks 436 and 440 for each data block received during a write operation and may then be stored along with their associated data blocks. Upon retrieval of the stored data block (s), the ECC code may be regenerated by ECC blocks 436 and 440 using the same algorithm, and compared to the previously stored ECCs to determine whether there is a disparity. If such a disparity exists, the data may then be corrected in accordance with the data correction capability that is associated with the particular ECC being utilized. If an error is detected, but cannot be corrected by the ECC, in one embodiment, an error handling procedure is triggered. This error handling procedure may include re-routing to another BRAM.

In particular, the corrected data that is generated by ECC blocks 436 and 440 is clocked through output data registers 442 and 444 to the FPGA fabric after a read request. Thus, ECC blocks 436 and 440 ensure that any data block retrieved from BRAMs 434 and 438 that is deemed to contain errors, may first be corrected within the limitations of the particular ECC being used prior to transmission to the requesting entity.

In addition, the corrected data may be fed back via feedback paths 446 and 448 to the first input of multiplexers 418 and 422. Under appropriate control of logic blocks 426-428, the read address that resulted in the corrupted data is applied as the subsequent write address to BRAMs 434 and/or 438, via multiplexers 420 and/or 424. In such an instance, the corrupted data at the last read address is overwritten, i.e., scrubbed, with the ECC corrected data being fed back during the second cycle of the 2× clock from clock generators 408 and/or 416.

Thus, in one embodiment, BRAMs 434 and 438 may first be accessed via a read operation in accordance with read address signals, READ-ADDR-A and READ-ADDR-B. The read operation may then be followed by a write operation in accordance with write address signals, WRITE-ADDR-A and WRITE-ADDR-B. The source of the write address signals, however, depends upon the results of the error detection that may be performed by ECC blocks 436 and 440 as discussed above.

If a data block read from BRAMs 434 and/or 438 results in an error, for example, then the read address signals from the immediately previous read operation, i.e., READ-ADDR-A and/or READ-ADDR-B, serve as the scrub address signals, SCRUB ADDR-A and/or SCRUB ADDR-B, for the subsequent write operation. In such an instance, multiplexers 420 and 424, under the control of logic blocks 426 and 428, are operative to select the appropriate scrub addresses in response to the read error signaling of ECC blocks 436 and/or 440. Similarly, the corrected data generated by ECC blocks 436 and 440 is selected as the scrub data via multiplexers 418 and/or 422.

If, on the other hand, the data block read from BRAMs 434 and/or 438 did not result in an error, then the write address signals, WRITE ADDR-A and/or WRITE ADDR-B as well as DATA IN-A and/or DATA IN-B, are the write address and data signals, respectively, that are selected via multiplexers 418-424 and logic blocks 426-428 for the subsequent write operation.

It should be noted, that the input and output registering, as well as the data and address multiplexing, operations implemented by the embedded logic circuit of FIG. 4 are performed at the 1× clock of clock generators 408 and 416. The 1× clock is the same clock frequency that is being utilized by FPGA fabric 312 and 318 of FIG. 3. In one embodiment, BRAMs 434 and 438 are double pumped, which is to say that the data access to/from BRAMs 434 and 438 is occurring at a 2× clock rate, which is twice the frequency of the 1× clock rate. Thus, simultaneous and independent read/write operations from the FPGA fabric may be performed at the 1× clock rate, while the resulting read/write operations performed on BRAMs 434 and 438 actually transpire at the 2× clock rate.

In addition, through operation of read enable and write enable control signals (not shown), a read operation followed by a write operation may occur as discussed above. Alternately, the control signals (not shown) may also be used to perform a write operation followed by a read operation. Under normal operating conditions, either operation may occur independently and simultaneously at the 1× clock rate.

Under a read error condition, however, a subsequent user directed write operation, i.e., using DATA IN-A/WRITE ADDR-A and/or DATA IN-B/WRITE ADDR-B, may be overridden through operation of ECC blocks 436 and 440. In such an instance, the user directed write operation is postponed until the scrubbing operation as discussed above is performed.

The virtual quad-port RAM of FIG. 4 is highly configurable, since logic blocks 426 and 428 may be under user control via FPGA fabric 312 and 318 of FIG. 3. Accordingly, any number of ECC/scrubbing combinations are contemplated by an embodiment of the present invention. In one embodiment, for example, the user may choose to disable the ECC functionality, whereby the error detection and correction functions within ECC blocks 436 and 440 are disabled altogether. Such may be the case, for example, if the user is continuously updating the contents of BRAMs 434 and 438, thereby inherently performing a scrubbing function through normal operation.

On the other hand, the user may wish to engage the ECC function along with scrubbing feedback paths 446 and 448, if BRAMs 434 and 438 are instead being used essentially as read only memory (ROM). In such an instance, BRAMs are essentially written with user data one time, with most of the subsequent memory accesses being read operations. Such may be the case, for example, when portions of BRAMs 434 and 438 are being used as table lookups to obtain static information. The longer the information contained within BRAMs 434 and 438 remains static, the greater the probability that information contained within BRAMs 434 and 438 may become corrupted. The user may wish, therefore, to safeguard the data stored within BRAMs 434 and 438 by performing the ECC operation in conjunction with each read operation performed and then scrubbing any corrupted portions of BRAMs 434 and 438 with the corrected data if necessary.

In an alternate embodiment, logic block 426 and 428 may be user configured, such that optional ECC blocks 436 and 440 perform their assigned error detection and correction capabilities, but multiplexers 418 and 422 are precluded from activating scrubbing feedback paths 446 and 448. In such an instance, data transmitted, e.g., DATA OUT-A and DATA OUT-B, to FPGA fabric 318 is error corrected within the limits of the ECC being used, but the corrected data is not being used to scrub the corrupted contents of BRAMs 434 and 438. In such an instance, memory access to the virtual quad-port RAM from FPGA fabric 312 is maximized, since both cycles of the 2× clock of clock generators 408 and 416 are (transparently) available to the user for read followed by write, or conversely, write followed by read functionality.

Figure 5:
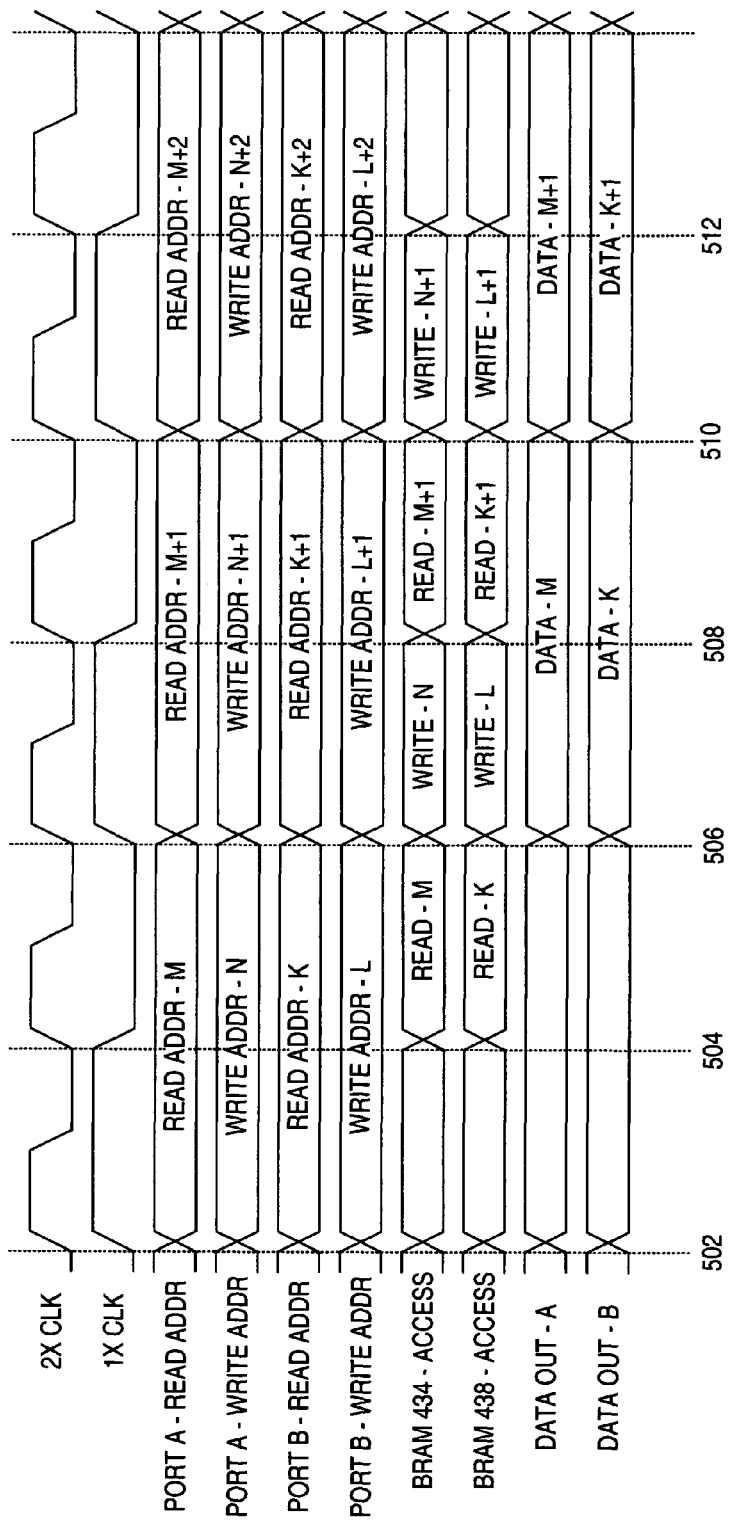
FIG. 5 illustrates an exemplary timing diagram of the operation of the embedded logic circuit block diagram of FIG. 4.

Turning to timing diagram 500 of FIG. 5, a detailed explanation of one embodiment of the operation of the virtual quad-port RAM of FIG. 4 in accordance with an embodiment of the present invention is provided. Although timing diagram 500 exemplifies a read first, then write operation, it is understood that any other BRAM memory access ordering flow may be similarly implemented, such as a write first then read, or any other data access ordering paradigm that may be desired.

At time 502, the rising edge of signal 1×CLK latches the read address signals, READ ADDR-M and READ ADDR-K, and the write address signals, WRITE ADDR-N and WRITE ADDR-L, as provided to registers 404-406 and 412-414 by FPGA fabric 312. In addition, port-A and port-B data is applied to registers 402 and 410, respectively, in support of any write operation that may be requested by FPGA fabric 312. Other control signals (not shown), such as read enable and write enable, are also latched and applied to BRAMs 434 and 438 as required.

Logic blocks 426 and 428 may be configured, such that signal 1×CLK is gated to the control terminals of multiplexers 420 and 424. Thus, multiplexers 420 and 424 may be configured by logic blocks 426 and 428 to first implement a read operation, i.e., read addresses, READ ADDR-M and READ ADDR-K, are passed through multiplexers 420 and 424, respectively, since in one embodiment, a logic high level of the signal 1×CLK may select the first inputs of multiplexers 420 and 424.

At time 504, the rising edge of signal 2×CLK latches the read address signals into BRAMs 434 and 438 and after a nominal delay, data signals, e.g., READ-M and READ-K, corresponding to the data contained within BRAMs 434 and 438 at the corresponding read address signal locations is made available to registers 442 and 444. At the same time, signal 1×CLK transitions to a logic low, which flips the selection control input of multiplexers 420 and 424 to select write address signals, WRITE ADDR-N and WRITE ADDR-L, for presentation to BRAMs 434 and 438, respectively.

At time 506, the rising edge of signal clock 2× latches the write address signals into BRAMs 434 and 438 along with the data signal at port A, WRITE-N, and the data signal at port B, WRITE-L, such that data locations at the corresponding write address locations are updated with data signals WRITE-N and WRITE-L. At the same time, the rising edge of signal 1×CLK latches data signals, DATA-M and DATA-K, from BRAMs 434 and 438 to the DATA OUT-A and DATA OUT-B outputs of registers 442 and 444, respectively. Thus, data corresponding to the data requested by the soft core at time 502 is made available to the soft core at time 506, while at the same time (relative to the FPGA fabric) the requested write operation is also processed. The read first, then write paradigm continues as may be verified at clock cycles 508-512.

Figure 6:
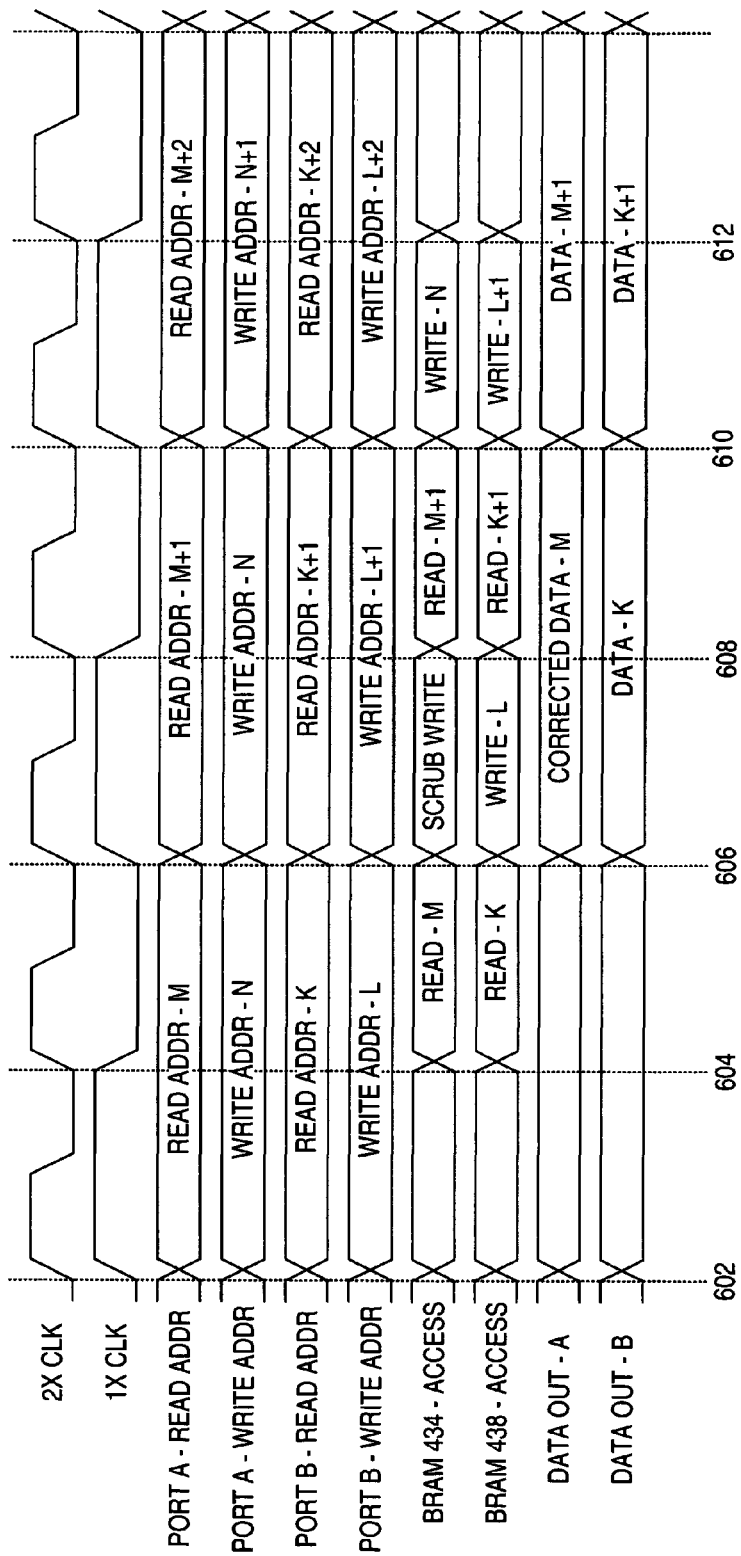
FIG. 6 illustrates an alternate timing diagram of the operation of the embedded logic circuit block diagram of FIG. 4.

Turning to timing diagram 600 of FIG. 6, a detailed explanation of another embodiment of the operation of the virtual quad-port RAM of FIG. 4 in accordance with the present invention is provided. In this instance, a scrub operation is exemplified, whereby the read first operation results in an error detection/error correction cycle on port-A, while port-B operates without error.

At time 602, the rising edge of signal 1×CLK latches the read address signals, READ ADDR-M and READ ADDR-K, and the write address signals, WRITE ADDR-N and WRITE ADDR-L, as provided to registers 404-406 and 412-414 by FPGA fabric 312. In addition, port-A and port-B data is applied to registers 402 and 414, respectively, in support of any write operation that may be requested by FPGA fabric 312. Other control signals (not shown), such as read enable and write enable, are also latched and applied to BRAMs 434 and 438 as required.

Logic blocks 426 and 428 may be configured, such that signal 1×CLK is gated to the control terminals of multiplexers 420 and 424. Thus, multiplexers 420 and 424 may be configured by logic blocks 426 and 428 to first implement a read operation, i.e., read addresses, READ ADDR-M and READ ADDR-K, are passed through multiplexers 420 and 424, respectively, since in one embodiment, a logic high level of the signal 1×CLK may select the first inputs of multiplexers 420 and 424.

At time 604, the rising edge of signal 2×CLK latches the read address signals into BRAMs 434 and 438. Once the read data, READ-M and READ-K, is fetched, ECC blocks 436 and/or 440 recompute an ECC based on the fetched data. The recomputed ECC is then compared to the ECC that was originally stored when the data was written into BRAMs 434 and 438. If a disparity exists between the stored ECC and the recomputed ECC, then a read error exists, which causes ECC blocks 436 and/or 440 to signal the read error to logic blocks 426 and/or 428.

As exemplified at time 606, read access from BRAM 434 resulted in the detection of a read data error, while the read access from BRAM 438 did not. After a nominal delay, therefore, data signal, e.g., READ-K, corresponding to the valid data contained within BRAM 438 is made available to register 444. The data presented to register 442, however, is the corrected data, generated by ECC 436, as a result of the read error from BRAM 434 at address location, READ ADDR-M.

At the same time, signal 1×CLK transitions to a logic low, which flips the selection control input of multiplexer 424 to select write address signal, WRITE ADDR-L, for presentation to BRAM 438. Logic block 426, however, as a result of the read error detected by ECC 436, maintains the selection control input of multiplexer 420 at a logic high, thus maintaining selection of read address signal, READ ADDR-A, as latched by register 404. Since a read error occurred at this address, READ ADDR-A also serves as the scrub address signal, SCRUB ADDR-A.

In particular, through application of signal, READ ADDR-A, along with a write enable (not shown) to BRAM 434, READ ADDR-A becomes the write address signal to BRAM 434, which is used to correct the corrupted data at address location READ ADDR-A. In addition, instead of the selection of user write data signal, DATA IN-A, logic block 426 flips the selection control input of multiplexer 418, such that the corrected data, as supplied by ECC block 436 via feedback path 446, is applied to BRAM 434.

At time 606, the rising edge of signal clock 2× latches the write address signals into BRAMs 434 and 438 along with data signals SCRUB WRITE and WRITE-L. In this instance, data signal SCRUB WRITE is the corrected data, as generated by ECC block 436, which is used to overwrite, or scrub, the corrupted data that exists at address location READ ADDR-A. Data signal WRITE-L is the user data applied to port DATA IN-B by FPGA fabric 312, such that the data location at WRITE ADDR-B is updated with data signal WRITE-L.

At the same time, the rising edge of signal 1×CLK latches data signals, CORRECTED DATA-M and DATA-K, from BRAMs 434 and 438 to the DATA OUT-A and DATA OUT-B outputs of registers 442 and 444, respectively. Thus, data corresponding to the data requested by the FPGA fabric at time 602 is made available to the soft core at time 606. In contrast to timing diagram 500 of FIG. 5, however, while data signals, CORRECTED DATA-M and DATA-K, correspond to the user requested data at time 602, the user write request presented to port-A was not honored. Instead, the user write request was overridden by the scrubbing cycle occurring during the third 2×CLK cycle at time 606. Thus, the user write cycle on port-A as requested at time 602 is not honored and issued again at 606 shown, such that the write request is honored at time 610 instead of at time 606. Otherwise, the read first, then write paradigm continues as may be verified at clock cycles 608-612.

As discussed above, the scrubbing operation may be bypassed, such that while corrected data is delivered to the FPGA fabric at time 606, feedback path 446 is blocked by logic block 426. In such an instance, the corrupted data within BRAM 434 is allowed to persist, in order to honor user write requests with no additional delay. Thus, in those applications whereby the data stored within BRAM 434 is flushed at a reasonable rate, sacrificing a user write cycle in favor of a scrubbing cycle may not be required to yield acceptable results, i.e., minimization of accumulated read errors is already accomplished by the flushing mechanism that is inherent with the application.

On the other hand, in those applications whereby the data stored within BRAM 434 is fairly static, sacrificing a user write cycle in favor of a scrubbing cycle may be necessary in order to minimize the accumulation of read errors. Thus, data scrubbing along with the ECC function may be activated as exemplified in FIG. 6. Alternately, logic blocks 426 and 428 may be user controlled to preclude the use of ECC and scrubbing altogether.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit (IC), comprising:
a plurality of configurable logic resources coupled to a plurality of configurable interconnect resources; and
an embedded logic circuit coupled to the configurable logic resources and configured to exchange internal data with the configurable logic resources, the embedded logic circuit including,
an input register bank coupled to latch a plurality of signals received from the configurable logic resources at a first clock rate; and
a non-configurable random access memory (RAM) bank coupled to receive a write address and a read address from the input register bank and configured to provide write and read access to storage locations within the RAM bank at a second clock rate that is faster than the first clock rate;
wherein the RAM bank is a dual-ported RAM that provides simultaneous access for respective addresses at first and second ports;
wherein the input register bank includes respective data input registers, respective read address registers, and respective write address registers for each port of the dual-ported RAM;
wherein the second clock rate is at least double the first clock rate, and the dual-ported RAM appears as a quad-ported RAM to the configurable logic resources with at least four accesses at the two ports of the dual-ported RAM being completed within one cycle of the first clock rate.

2. The IC of claim 1, further comprising a first multiplexer coupled to receive the read address from a respective read address register and the write address from a respective write-address register, and in a first selection state, configured to provide the read address to the RAM bank during a first phase of one cycle of the first clock rate and configured to provide the write address to the RAM bank during a second phase of the one cycle of the first clock rate.

3. The IC of claim 2, further comprising a second multiplexer coupled to receive the data from a respective data input register and in the first selection state, adapted to provide the data to the write address of the RAM bank.

4. The IC of claim 3, wherein the RAM bank comprises an ECC block configured to detect errors between data read from the read address and data written to the write address.

5. The IC of claim 4, wherein the ECC block is further configured to correct errors in the data read from the read address.

6. The IC of claim 5, wherein the ECC block is further configured to switch the first and second multiplexers from the first selection state to a second selection state in response to correcting errors in the data read from the read address.

7. The IC of claim 6, wherein the first multiplexer is further configured to provide the read address to the RAM bank during the second phase of the one cycle of the first clock during the second selection state.

8. The IC of claim 7, wherein the second multiplexer is further coupled to receive the corrected data from the ECC block and further configured to provide the corrected data from the ECC block to the read address of the RAM bank in response to the second selection state.

9. In a programmable logic device (PLD), an embedded logic circuit comprising:

a first port register set including a first data input register, a first read address register, and a first write address register;

a second port register set including a second data input register, a second read address register, and a second write address register, wherein signals at the first port register set and second port register set are received at a first clock rate;

a respective first multiplexer coupled to receive user data from the respective data input register of the first and second port register sets and respective scrubbing data and configured to provide the user data in response to a first level of a control signal and configured to provide the scrubbing data in response to a second level of the control signal;

a random access memory (RAM) block coupled to the first multiplexer and configured to retrieve stored user data from a first address, the RAM block including, an error correction coding (ECC) block configured to detect errors in the retrieved user data and configured to generate the first level of the control signal in response to an absence of detected errors and configured to generate the second level of the control signal and the scrubbing data in response to a presence of detected errors, wherein the RAM block is configured to overwrite the retrieved user data at the first address with the scrubbing data in response to the second level of the control signal;

wherein the RAM block is a dual-ported RAM that provides simultaneous access for respective addresses at first and second ports, and provides access to storage locations within the RAM block at a second clock rate that is at least double the first clock rate;

wherein each of the first and second ports is coupled to the first port register set and second port register set, respectively;

wherein the dual-ported RAM appears as a quad-ported RAM with at least four accesses at the two ports of the dual-ported RAM being completed within one cycle of the first clock rate.

10. The embedded logic circuit of claim 9, further comprising a respective second multiplexer coupled to receive the first address from the respective read address register and a second address from the respective write address register and in response to the first level of the control signal, being configured to provide the first address to the RAM block during a first phase of one cycle of the first clock rate and to provide the second address to the RAM block during a second phase of the one cycle of the first clock rate.

11. The embedded logic circuit of claim 10, wherein in response to the second level of the control signal, the respective second multiplexer being configured to provide the first address to the RAM block during the first phase of the one cycle of the first clock rate and to provide the first address of the RAM block during the second phase of the one cycle of the first clock rate.

* * * * *